(12) United States Patent
Wada et al.

(10) Patent No.: US 9,472,730 B2
(45) Date of Patent: Oct. 18, 2016

(54) LIGHT EMITTING DEVICE

(71) Applicant: TOYODA GOSEI CO., LTD., Kiyosu-shi (JP)

(72) Inventors: Satoshi Wada, Kiyosu (JP); Kosei Fukui, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 14/631,747

(22) Filed: Feb. 25, 2015

(65) Prior Publication Data
US 2015/0280080 A1 Oct. 1, 2015

(30) Foreign Application Priority Data

Mar. 28, 2014 (JP) ................. 2014-069748

(51) Int. Cl.
*H01L 33/50* (2010.01)
*H01L 33/52* (2010.01)
*H01L 33/56* (2010.01)
H01L 25/075 (2006.01)
H01L 33/46 (2010.01)

(52) U.S. Cl.
CPC ............ *H01L 33/502* (2013.01); *H01L 33/50* (2013.01); *H01L 33/504* (2013.01); *H01L 33/52* (2013.01); *H01L 33/56* (2013.01); H01L 25/0753 (2013.01); H01L 33/46 (2013.01); H01L 33/501 (2013.01); H01L 2924/0002 (2013.01); H01L 2933/0091 (2013.01)

(58) Field of Classification Search
None
See application file for complete search history.

(56) References Cited

U.S. PATENT DOCUMENTS

| 2008/0054279 | A1* | 3/2008 | Hussell | H01L 33/54 257/95 |
| 2008/0149960 | A1* | 6/2008 | Amo | H01L 33/486 257/98 |
| 2011/0210358 | A1* | 9/2011 | Kim | H01L 33/508 257/98 |

FOREIGN PATENT DOCUMENTS

| JP | 2003-243727 A | 8/2003 |
| JP | 2008-103688 A | 5/2008 |

* cited by examiner

Primary Examiner — Minh-Loan Tran
(74) Attorney, Agent, or Firm — McGinn IP Law Group, PPLC

(57) ABSTRACT

A light emitting device includes a light emitting element and a luminescent color conversion layer covering a light emitting surface of the light emitting element. The luminescent color conversion layer includes a transparent synthetic resin material and integrated particles provided inside the transparent synthetic resin material, each of the integrated particles being a mixture of phosphors and a dispersively binding material that are bonded to each other. The dispersively binding material has transparency and bondability to the phosphors. The luminescent color conversion layer is arranged such that primary light and secondary light are mixed to generate a mixed color light and such that the mixed-color light is emitted outside from the luminescent color conversion layer, the primary light being excitation light emitted by the light emitting element, and the secondary light being a portion of the primary light that has been is color-converted by an excitation of the phosphors.

7 Claims, 3 Drawing Sheets

LIGHT EMITTING DEVICE

CROSS-REFERENCE TO RELATED APPLICATIONS

The present application claims priority from Japanese Patent Application No. 2014-069748 filed on Mar. 28, 2014, the entire content of which is incorporated herein by reference.

FIELD OF INVENTION

The present invention relates to a light emitting device and, more particularly, to a light emitting device including a luminescent color conversion layer for converting the color of light emitted by a light emitting element.

RELATED ART

According to a first related art, to form an LED lamp such that phosphors are distributed in a desirable manner, a method of forming the LED lamp includes steps of forming a suspension by mixing a plurality of phosphor particles in a polymer resin that is not cured, placing the suspension at a position adjacent to an LED chip, reducing the viscosity of the resin by increasing the temperature of the suspension and precipitating the phosphor particles at a desired position in the resin relative to the LED chip, and curing the resin by further increasing the temperature of the suspension (see, e.g., JP 2008-103688 A).

According to a second related art, a light emitting device has a light emitting element and a coating layer made of a binder containing fluorescent materials. Here, the binder is a light-transmissive resin that contains fine particles of a diffusing agent. At the time of coating the light emitting element by the coating layer, a coating liquid forming the coating layer is adhered to the light emitting element by a spray coating and then dried (see, e.g., JP 243727 A).

In the first related art, when the thickness of the phosphor layer is increased in order to fill gaps between the phosphors, the luminescent color-converted light at a side closer to the LED chip is re-incident on the phosphors deposited thereon. Accordingly, the light is absorbed and blocked. Further, when the particle size of the phosphors is large, the gaps between the phosphors are widened. Accordingly, the amount of the light that is not incident on the phosphors is increased. Therefore, in the first related art, in order to obtain a uniform chromaticity distribution by improving the uniformity of the luminescent color of the light emitting device (LED lamp) and to prevent the amount of light from being reduced by the light shielding (internal scattering) by the phosphors, it is required to uniformly and densely disperse the phosphors having a small particle size in the vicinity of the light emitting surface (upper surface and side surface) of the light emitting element (LED chip).

However, since the phosphors having a small particle size are liable to be associated and aggregated, it is difficult to uniformly and densely disperse the phosphors in the vicinity of the light emitting surface of the light emitting element. Therefore, there may be an option of mixing dispersant (diffusing agent) powders (dispersing particles) in the phosphors to dispersing the phosphors. However, upon increasing the concentration of the dispersing powder in the synthetic resin material (polymer resin) so as to more uniformly disperse the phosphors, the phosphors are hardly precipitated in the synthetic resin material. That is, even when using the dispersant, it is difficult to uniformly and densely disperse the phosphors in the vicinity of the light emitting surface of the light emitting element.

In the second related art, the phosphors are not precipitated in the light-transmissive resin and the coating layer made of the binders containing the fluorescent materials is formed by a spray coating. Accordingly, the problems associated with the precipitation of the phosphors do not occur. However, the phosphors are aggregated with each other in an organic solvent or the phosphors are aggregated with each other immediately after the spray coating. Accordingly, it is insufficient to prevent the association and aggregation of the phosphors having a small particle size and it is difficult to uniformly disperse the phosphors.

SUMMARY

Illustrative aspects of the present invention provide a light emitting device capable of uniformly and densely disperse the phosphors having a small particle size in the vicinity of a light emitting surface of a light emitting element.

According to an aspect of the present invention, a light emitting device includes a light emitting element configured to emit light, and a luminescent color conversion layer covering a light emitting surface of the light emitting element. The luminescent color conversion layer includes a transparent synthetic resin material and integrated particles provided inside the transparent synthetic resin material, each of the integrated particles being a mixture of phosphors and a dispersively binding material that are bonded to each other. The dispersively binding material has transparency and bondability to the phosphors. The luminescent color conversion layer is configured and arranged such that primary light and secondary light are mixed to generate a mixed color light and such that the mixed-color light is emitted outside from the luminescent color conversion layer, the primary light being excitation light emitted by the light emitting element, and the secondary light being a portion of the primary light that has been is color-converted by an excitation of the phosphors contained in the luminescent color conversion layer.

In the integrated particles, the phosphors are bonded in a state of being dispersed by the dispersively binding material. In other words, the dispersively binding material has a function of binding the phosphors and a function of dispersing the phosphors. Therefore, by sufficiently increasing the particle size of the integrated particles, the integrated particles can be uniformly dispersed in the liquid-phase synthetic resin material without being associated and aggregated even when the particle size of the phosphors is reduced.

When coating the light emitting surface of the light emitting element by the luminescent color conversion layer, the liquid-phase luminescent color conversion layer is coated on the light emitting surface of the light emitting element and then the luminescent color conversion layer is cured. By doing so, it is possible to maintain a state where the light emitting surface of the light emitting element is uniformly and densely covered by a large number of integrated particles. Further, it is possible to uniformly and densely disperse the phosphors having a small particle size in the vicinity of the light emitting surface of the light emitting element.

Further, by reducing the particle size of the phosphors, it is possible to produce a state where a plurality of phosphors are distributed to be overlapped in a thickness direction of the luminescent color conversion layer covering the light emitting surface of the light emitting element. Accordingly, the scattering of light by at least one of the phosphors or the dispersively binding material occurs in the interior of the luminescent color conversion layer, so that it is possible to obtain a uniform chromaticity distribution. In addition, the integrated particle may be a particle obtained by the association and aggregation of the phosphor particles and the dispersively binding material particles, or a particle of a sintered body of the phosphors and the dispersively binding material.

Dispersing powders may be mixed in the synthetic resin material to disperse the integrated particles. With this configuration, the dispersing powder allows the integrated particles to be more uniformly dispersed in the liquid-phase synthetic resin material. Accordingly, it is possible to reliably obtain the advantageous effect described above.

The phosphors may be garnet-based phosphors and the dispersively binding material may be an alumina. With this configuration, it is possible to easily form the luminescent color conversion layer that is capable of reliably obtaining the advantageous effect described above. Further, the garnet-based phosphors contain aluminum oxide and thus the constituent elements of the phosphors and the dispersively binding material are common. Accordingly, it is possible to improve the bonding strength between the phosphors and the dispersively binding material. In addition, the refractive index difference between the phosphors and the dispersively binding material is small, so that it is possible to reduce light loss.

A particle size of the phosphors may be in a range of 1 µm to 7 µm. The particle size of the phosphors is substantially equal to a particle size of the dispersively binding material. In a case in which the particle size of the phosphors is greater than the above range, the portion inside the luminescent color conversion layer, in which the phosphors are not present, becomes larger when the luminescent color conversion layer is thinly formed. Accordingly, it is not possible to obtain a uniform chromaticity distribution. In a case in which the particle size of the phosphors is less than the above range, the efficiency of the luminescent color conversion by the excitation of the phosphors is lowered. Accordingly, it is not possible to obtain a desired luminescent color. Further, by causing the particle size of the phosphors to be substantially the same as the particle size of the dispersively binding material, it is possible to uniformly mix and bond the phosphors and the dispersively binding material.

A particle size of the integrated particles may be equal to or greater than 10 µm. In a case in which the particle size of the integrated particles is less than the above range, the association and aggregation of the integrated particles in the liquid-phase synthetic resin material is liable to occur. Accordingly, it is difficult to uniformly disperse the integrated particles in the liquid-phase synthetic resin material.

Inside the luminescent color conversion layer, the integrated particles may be distributed in a region near the light emitting surface of the light emitting element. With this configuration, when coating the light emitting surface of the light emitting element by the luminescent color conversion layer, the liquid-phase luminescent color conversion layer is coated on the light emitting surface of the light emitting element and the integrated particles are precipitated in the synthetic resin material by gravity. After the precipitation is ended, the synthetic resin material is cured. Thereby, it is possible to maintain a state where the light emitting surface of the light emitting element is uniformly and densely covered by a large number of integrated particles. Further, it is possible to uniformly and densely disperse the phosphors having a small particle size in the vicinity of the light emitting surface of the light emitting element.

A thickness of the luminescent color conversion layer may be equal to or smaller than three times a particle size of the integrated particles. In a case in which the thickness of the luminescent color conversion layer is thicker than the above range, the above advantageous effect (to be described later) that is achieved by thinly forming the luminescent color conversion layer cannot be obtained. In a case in which the thickness of the luminescent color conversion layer is thinner than the above range, there is a possibility that the phosphors are not present at a portion inside the luminescent color conversion layer. Accordingly, it is not possible to obtain a uniform chromaticity distribution.

By reducing the particle size of the phosphors, the portion inside the luminescent color conversion layer, in which the phosphors are not present, becomes extremely small even when the luminescent color conversion layer is thinly formed. Accordingly, it is possible to obtain a uniform chromaticity distribution. Further, by reducing the particle size of the phosphors, it is possible to produce a state where a plurality of phosphors are distributed to be overlapped in the thickness direction of the luminescent color conversion layer even when the luminescent color conversion layer is thinly formed. Accordingly, the scattering of light by at least one of the phosphors or the dispersively binding material occurs in the interior of the luminescent color conversion layer, so that it is possible to obtain more uniform chromaticity distribution.

By the way, light energy that is not converted during the luminescent color conversion becomes thermal energy to cause the phosphors in the luminescent color conversion layer to generate heat. Accordingly, the temperature of the phosphors is raised and the efficiency of the luminescent color conversion is lowered. Further, the components of the light emitting device are deteriorated due to the heat-generation. Accordingly, it is necessary to efficiently dissipate the heat generated by the phosphors. Therefore, when the luminescent color conversion layer is thinly formed, heat is prevented from being confined in the luminescent color conversion layer and the heat generated by the luminescent color conversion layer is efficiently dissipated through a light emitting element adjacent to the luminescent color conversion layer. As a result, the temperature rise of the luminescent color conversion layer is suppressed and the efficiency decrease of the luminescent color conversion (wavelength conversion) is prevented. Further, the components of the light emitting device are prevented from being deteriorated by the heat generated by the luminescent color conversion layer, so that it is possible to achieve higher output of the light emitting device. As a result, with the luminescent color conversion layer that is thinly formed, it is possible to easily achieve both the higher output and the uniform chromaticity distribution.

DETAILED DESCRIPTION

Figure 1:
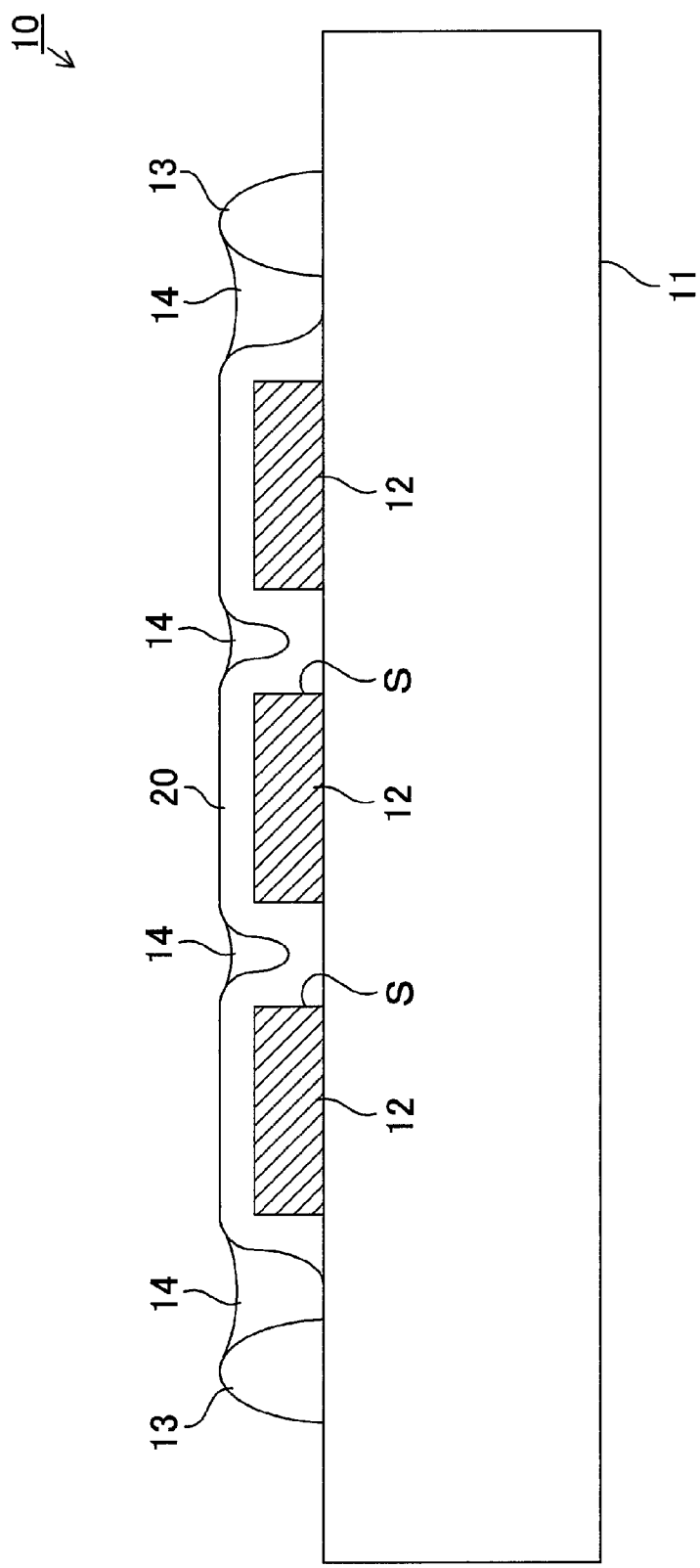
FIG. 1 is a longitudinal sectional view showing a schematic configuration of a light emitting device according to a first embodiment of the present invention.

Hereinafter, illustrative embodiments of the present invention will be described in detail with reference to the drawings. In the respective embodiments, same elements are denoted by same reference numerals, and repetitive description of common features will be omitted. In the drawings, for the purpose of simplifying the illustration, sizes, shapes and arrangements of the elements in the respective embodiments may not correspond to the actual sizes, shapes and arrangements of the elements, and may be schematically shown in an exaggerated manner.

First Embodiment

As shown in FIG. 1, a light emitting device 10 according to a first embodiment includes an insulating substrate 11, a light emitting diode (LED) chip 12, a frame 13, a reflective layer 14, a luminescent color conversion layer 20 and the like. For example, the insulating substrate (mounting board) 11 is formed by a substrate made of a bulk material of an insulating material (e.g., ceramic material such as aluminum nitride, synthetic resin material and the like) or a substrate where an insulating layer is provided on a surface of a metallic material (e.g., aluminum alloy, pure copper, copper-based alloy and the like).

A plurality of (three in the illustrated example) LED chips 12 is a blue LED having a substantially rectangular parallelepiped shape and arranged in a row with a gap S therebetween. Bottom surfaces of each LED chip 12 are electrically connected and fixedly bonded to a wiring layer (not shown) formed on the surface of the insulating substrate 11 using various bonding methods (e.g., soldering, stud bump bonding, metallic fine particle bonding, surface activation bonding and the like). It should be noted that the LED chips 12 may be substituted with any semiconductor light emitting element (e.g., electroluminescent (EL) element). The luminescent color conversion layer (wavelength conversion layer or phosphor layer) 20 is formed on the surface of the insulating substrate 11 so as to cover the upper surfaces and the side surfaces of each LED chip 12.

The frame 13 has a substantially rectangular frame shape, as seen in a plan view. The frame 13 is formed on the surface of the insulating substrate 11 so as to surround each LED chip 12 that is covered by the luminescent color conversion layer 20. The frame 13 is formed by a white synthetic resin material (e.g., silicon-based resin, epoxy-based resin and the like) that contains fine particles of material (e.g., titanium oxide, aluminum oxide and the like) with high light reflectivity, a light-reflective ceramic material (e.g., aluminum oxide), a light-reflective metallic material (e.g., aluminum alloy). The frame 13 also functions as a reflector.

The reflective layer 14 is filled into a space which is surrounded by each LED chip 12 covered by the luminescent color conversion layer 20, the surface of the insulating substrate 11 exposed from the luminescent color conversion layer 20 and an inner peripheral wall surface of the frame 13. The reflective layer 14 is injected to the inside of the frame 13 so that the reflective layer seals each LED chip 12 and the luminescent color conversion layer 20. The reflective layer 14 is formed by a white synthetic resin material (e.g., silicon-based resin, epoxy-based resin and the like) that contains fine particles of material (e.g., titanium oxide, aluminum oxide and the like) with high light reflectivity.

Luminescent Color Conversion Layer 20

Figure 2A:
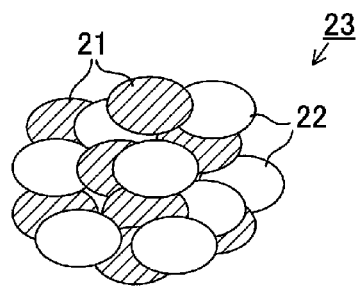
FIGS. 2A and 2B are schematic views for explaining a method of manufacturing a luminescent color conversion layer of the first embodiment.

As shown in FIG. 2A, integrated particles (luminescent color conversion particles) 23 are manufactured by mixing phosphors 21 and dispersively binding material 22 and associating and aggregating the phosphors 21 and the dispersively binding material 22. As the phosphors 21, any one of a garnet-based phosphor (e.g., YAG phosphor, LuAG phosphor, TAG phosphor and the like), a SiAlON phosphor, a CASN phosphor, a fluoride-based phosphor and a BOS phosphor may be used. Among these, the garnet-based phosphor is preferred since it has a high thermal stability.

The dispersively binding material (binder) 22 may be any material (e.g., alumina) that has transparency and bondability to the phosphors 21. However, it is preferable to use the materials having the same constituent element as the phosphors 21 because the bonding strength to the phosphors 21 is improved. Further, in this case, since the refractive index difference between the materials and the phosphors 21 is small, it is also possible to reduce light loss. When using the garnet-based phosphors as the phosphors 21, it is preferable to use alumina as the dispersively binding material 22 since the garnet-based phosphors contain aluminum oxide. Further, in order to associate and aggregate the phosphors 21 and the dispersively binding material 22, any methods may be used. For example, a method of simply mixing the phosphors 21 and the dispersively binding material 22, or a method of mixing the phosphors 21 and the dispersively binding material 22 in a proper solution to form a slurry and then removing the solution, a method of aggregating the phosphors 21 and the dispersively binding material 22 and then sintering them may be used.

In the case of YAG, a suitable particle size of the phosphors 21 is in a range of 1 μm to 7 μm, preferably in a range of 2 μm to 5 μm. In a case in which the particle size of the phosphors 21 is greater than the above range, the portion inside the luminescent color conversion layer 20, in which the phosphors 21 are not present, becomes larger when the luminescent color conversion layer 20 is thinly formed. Accordingly, it is not possible to obtain a uniform chromaticity distribution. In a case in which the particle size of the phosphors 21 is less than the above range, the efficiency of the luminescent color conversion by the excitation of the phosphors is lowered. Accordingly, it is not possible to obtain a desired luminescent color. Further, by causing the particle size of the dispersively binding material 22 to be substantially the same as the particle size of the phosphors 21, it is possible to uniformly mix and associate and aggregate the phosphors 21 and the dispersively binding material 22.

Figure 2B:
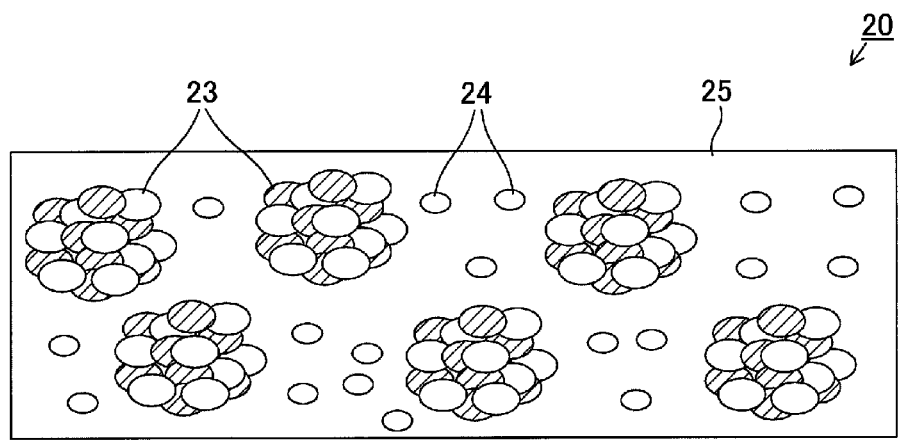

As shown in FIG. 2B, the liquid-phase luminescent color conversion layer 20 is produced by mixing the integrated particles 23 and dispersing powders 24 to a transparent synthetic resin material 25 (e.g., epoxy-based resin, silicon-based resin, acrylic-based resin, nylon-based resin and the like). In the liquid-phase luminescent color conversion layer 20, the integrated particles 23 and the dispersing powders 24 are uniformly dispersed in the liquid-phase synthetic resin material 25.

A suitable particle size of the integrated particles 23 equal to or greater than 10 μm, preferably greater than 20 μm. In a case in which the particle size of the integrated particles 23 is less than the above range, the association and aggregation of the integrated particles 23 in the liquid-phase synthetic resin material 25 is liable to occur. Accordingly, it is difficult to uniformly disperse the integrated particles 23 in the liquid-phase synthetic resin material 25.

As the dispersing powders (dispersing particles, diffusing powders) 24, any material (e.g., barium titanate, titanium oxide, aluminum oxide, silicon oxide and the like) may be used, so long as the material can disperse the integrated particles 23 in the liquid-phase synthetic resin material 25.

As shown in FIG. 1, the luminescent color conversion layer 20 is formed so as to cover the upper surfaces and the side surfaces of each LED chip 12. To this end, first, a suitable application device (e.g., a dispenser, an electrostatic application device, a screen printing device, a spray coating device and the like) is used to coat the liquid-phase luminescent color conversion layer 20 on the upper surfaces and the side surfaces of each LED chip 12.

Here, since the dispersing powders 24 are mixed in the synthetic resin material 25, the integrated particles 23 in the synthetic resin material 25 can be prevented from being associated and aggregated with each other in the interior (e.g., in a syringe) of the application device.

Then, the temperature of the synthetic resin material 25 is maintained for a sufficient time in an optimized state so that the integrated particles 23 are precipitated in the synthetic resin material 25 by gravity and a large number of integrated particles 23 uniformly and densely cover the upper surfaces and the side surfaces of the LED chips 12. Thereafter, the synthetic resin material 25 is cured so as to maintain a state where a large number of integrated particles 23 uniformly and densely cover the upper surfaces and the side surfaces of the LED chips 12. In addition, as a method of curing the synthetic resin material 25, a proper method can be used to suit a curing property (e.g., a thermosetting property, a photo-curing property, a reactive-curing property, a solvent volatilization curing property) of the synthetic resin material 25.

Advantageous Effects of First Embodiment

In the light emitting device 10 of the first embodiment, primary light (blue light) is excitation light emitted by the LED chips (light emitting element) 12, and the phosphors 21 contained in the luminescent color conversion layer 20 are excited by a portion of the primary light to generate a luminescent color-converted secondary light (yellow light). The primary light and the secondary light are mixed to generate a mixed-color light (white light). The mixed-color light is emitted outside from the light emitting device 10 through the luminescent color conversion layer 20.

In the liquid-phase luminescent color conversion layer 20, the integrated particles 23 and the dispersing powders 24 are uniformly dispersed in the liquid-phase synthetic resin material 25. In the integrated particles 23, the phosphors 21 are bonded in a state of being dispersed by the dispersively binding material 22. In other words, the dispersively binding material 22 has a function of binding the phosphors 21 and a function of dispersing the phosphors 21. Therefore, by sufficiently increasing the particle size of the integrated particles 23, the integrated particles 23 can be uniformly dispersed in the liquid-phase synthetic resin material 25 without being associated and aggregated even when the particle size of the phosphors 21 is reduced.

In addition, since the dispersing powders 24 are mixed in the synthetic resin material 25, the integrated particles 23 can be more uniformly dispersed in the liquid-phase synthetic resin material 25. The integrated particles 23 are hardly associated and aggregated in the synthetic resin material 25 when the particle size of the integrated particles 23 is sufficiently increased. Accordingly, the dispersing powders 24 may be omitted.

Further, in the first embodiment, the liquid-phase luminescent color conversion layer 20 is coated on the upper surfaces and the side surfaces of each LED chip 12, which are light emitting surfaces. The integrated particles 23 are precipitated in the synthetic resin material 25 by gravity. After the precipitation is ended, the synthetic resin material 25 is cured. Then, by the presence of the integrated particles 23 precipitated in the synthetic resin material 25, inside the luminescent color conversion layer 20, the integrated particles 23 are distributed in a region near the upper surfaces and the side surfaces of each LED chip 12. In other words, when the integrated particles 23 are distributed in the region, inside the luminescent color conversion layer 20, near the upper surfaces and the side surfaces of each LED chip 12, it can be said that the integrated particles 23 are precipitated in the liquid-phase synthetic resin material 25. Thereby, it is possible to maintain a state where the upper surfaces and the side surfaces of each LED chip 12 are uniformly and densely covered by a large number of integrated particles 23. Further, it is possible to uniformly and densely disperse the phosphors 21 having a small particle size in the vicinity of the upper surfaces and the side surfaces of each LED chip 12.

Here, when the concentration of the dispersing powders 24 in the synthetic resin material 25 is increased, the integrated particles 23 are less likely to be precipitated in the synthetic resin material 25. However, in the first embodiment, the integrated particles 23 can be uniformly dispersed in the liquid-phase synthetic resin material 25. Accordingly, it is not required to increase the concentration of the dispersing powders 24 in the synthetic resin material 25. As a result, there is no case that the precipitation of the integrated particles 23 is hindered.

Further, by reducing the particle size of the phosphors 21, it is possible to produce a state where a plurality of phosphors 21 are distributed to be overlapped in a thickness direction of the luminescent color conversion layer 20 covering the upper surfaces and the side surfaces of the LED chips 12. Accordingly, the scattering of light by at least one of the phosphors 21 or the dispersively binding material 22 occurs in the interior of the luminescent color conversion layer 20, so that it is possible to obtain a uniform chromaticity distribution. In contrast, when the integrated particles 23 is not used and the phosphors 21 having a large particle size (e.g., 15 μm or more) are mixed to the synthetic resin material 25, approximately one or two phosphors are located in the thickness direction of the luminescent color conversion layer 20 covering the upper surfaces and the side surfaces of the LED chips 12. Accordingly, it is not possible to produce a state where a plurality of phosphors 21 are distributed to be overlapped in the thickness direction of the luminescent color conversion layer 20. Therefore, the emitted light of the LED chips 12 directly passes through the portion between the phosphors 21. As a result, it is not possible to obtain a uniform chromaticity distribution.

Second Embodiment

Figure 3:
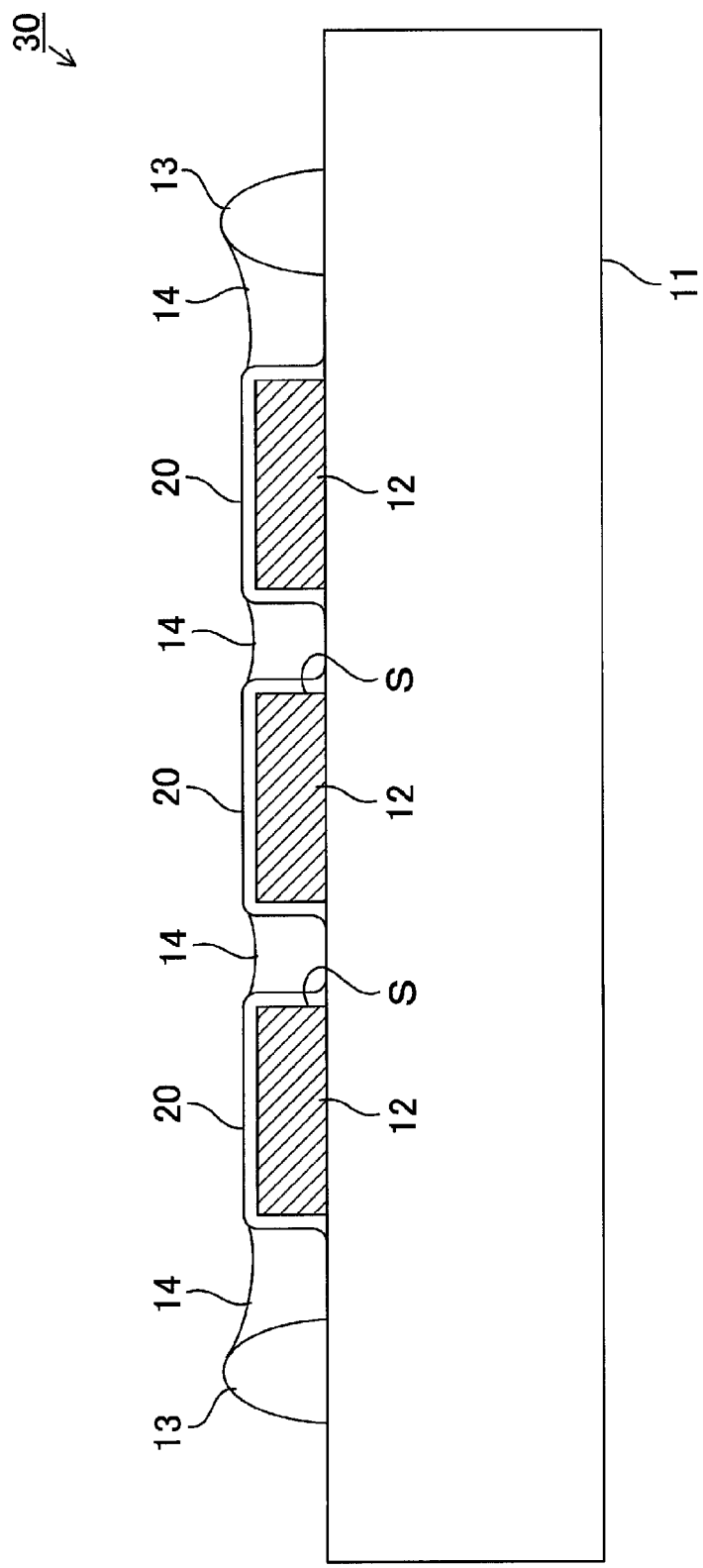
FIG. 3 is a longitudinal sectional view showing a schematic configuration of a light emitting device according to a second embodiment of the present invention.

As shown in FIG. 3, a light emitting device 30 of a second embodiment includes the insulating substrate 11, the LED chip 12, the frame 13, the reflective layer 14, the luminescent color conversion layer 20 and the like. The light emitting device 30 of the second embodiment is different from the light emitting device 10 of the first embodiment in that the thickness of the luminescent color conversion layer 20 is thinner.

In the second embodiment, when coating the liquid-phase luminescent color conversion layer 20 on the upper surfaces and the side surfaces of each LED chip 12, the coating amount of the luminescent color conversion layer 20 is reduced. In this way, the luminescent color conversion layer 20 having a thin thickness (e.g., about 15 μm to 40 μm) is formed. When the thickness of the luminescent color conversion layer 20 is thin, the integrated particles 23 are not precipitated in the synthetic resin material 25. When the luminescent color conversion layer 20 is coated, it is preferable to quickly cure the synthetic resin material 25.

Advantageous Effects of Second Embodiment

In the light emitting device 30 of the second embodiment, by reducing the particle size of the phosphors 21, the portion inside the luminescent color conversion layer 20, in which the phosphors 21 are not present, becomes extremely small even when the luminescent color conversion layer 20 is thinly formed. Accordingly, it is possible to obtain a uniform chromaticity distribution. Further, by reducing the particle size of the phosphors 21, it is possible to produce a state where a plurality of phosphors 21 are distributed to be overlapped in the thickness direction of the luminescent color conversion layer 20 even when the luminescent color conversion layer 20 is thinly formed. Accordingly, the scattering of light by at least one of the phosphors 21 or the dispersively binding material 22 occurs in the interior of the luminescent color conversion layer 20, so that it is possible to obtain more uniform chromaticity distribution.

By the way, light energy that is not converted during the luminescent color conversion becomes thermal energy to cause the phosphors in the luminescent color conversion layer 20 to generate heat. Accordingly, the temperature of the phosphors is raised and the efficiency of the luminescent color conversion is lowered. Further, the components (the insulating substrate 11, the LED chip 12, the frame 13, the reflective layer 14 and the like) of the light emitting device 30 are deteriorated due to the heat-generation. Accordingly, it is necessary to efficiently dissipate the heat generated by the phosphors.

Therefore, when the luminescent color conversion layer 20 is thinly formed, heat is prevented from being confined in the luminescent color conversion layer 20 and the heat generated by the luminescent color conversion layer 20 is efficiently dissipated through the LED chip 12 adjacent to the luminescent color conversion layer 20. As a result, the temperature rise of the luminescent color conversion layer 20 is suppressed and the efficiency decrease of the luminescent color conversion is prevented. Further, the components of the light emitting device 30 are prevented from being deteriorated by the heat generated by the luminescent color conversion layer 20, so that it is possible to achieve higher output of the light emitting device 30. As a result, according to the light emitting device 30 including the luminescent color conversion layer 20 that is thinly formed, it is possible to easily achieve both the higher output and the uniform chromaticity distribution.

A suitable range of the thickness of the luminescent color conversion layer 20 is equal to or smaller than three times the particle size of the integrated particles 23, preferably not more than the twice the particle size of the integrated particles 23. In a case in which the thickness of the luminescent color conversion layer 20 is thicker than the above range, the above advantageous effect that is achieved by thinly forming the luminescent color conversion layer 20 cannot be obtained. In a case in which the thickness of the luminescent color conversion layer 20 is thinner than the above range, there is a possibility that the phosphors 21 are not present at a portion inside the luminescent color conversion layer 20. Accordingly, it is not possible to obtain a uniform chromaticity distribution.

Further, in the light emitting device 30 of the second embodiment, the viscosity of the luminescent color conversion layer 20 can be improved by mixing the integrated particles 23 to the synthetic resin material 25. Accordingly, the side surfaces of each LED chip 12 can be reliably covered by the luminescent color conversion layer 20. In addition, it is possible to prevent that the luminescent color conversion layer 20 is unnecessarily spread over the surface of the insulating substrate 11 or that the luminescent color conversion layer 20 creeps up along an inner peripheral wall surface of the frame 13 from the surface of the insulating substrate 11. In the light emitting device 30 of the second embodiment, the frame 13 and the reflective layer 14 may be omitted.

By the way, in the above illustrative embodiments, the integrated particles 23 are produced by the association and aggregation of the particles of the phosphors 21 and the particles of the dispersively binding material 22. However, since it is difficult to control the association and aggregation state, it is difficult to control the particle size of the integrated particles 23. For this reason, the integrated particles 23 may be produced using the following method. That is, respective raw materials of the phosphors and the dispersively binding material are mixed and then burnt, thereby producing a integrated body where particulate phosphors and particulate dispersively binding material are mixed to each other. Then, the integrated body is pulverized to produce the integrated particles 23. This method is preferable since the existing techniques for pulverizing the integrated particles 23 can be applied and it is possible to improve productivity. That is, the integrated particles (luminescent color conversion particles) 23 may be a particle obtained by the association and aggregation of the particles of the phosphors and the particles of the dispersively binding material, or a particle of a sintered body prepared by sintering the phosphors and the dispersively binding material.

While the present invention has been described with reference to certain aspects and embodiments thereof, the scope of the present invention is not limited to the exemplary embodiments described above, and it will be understood by those skilled in the art that various changes and modifications may be made therein without departing from the scope of the present invention as defined by the appended claims.

What is claimed is:

1. A light emitting device, comprising:
   a light emitting element configured to emit light; and
   a luminescent color conversion layer covering a light emitting surface of the light emitting element,
   wherein the luminescent color conversion layer comprises a transparent synthetic resin material and integrated particles provided inside the transparent synthetic resin material, each of the integrated particles comprising a mixture of phosphors and a dispersively binding material that are bonded to each other,
   wherein the dispersively binding material has transparency and bondability to the phosphors,
   wherein the luminescent color conversion layer is configured and arranged such that primary light and secondary light are mixed to generate a mixed-color light and such that the mixed-color light is emitted outside from the luminescent color conversion layer, the primary light including excitation light emitted by the light emitting element, and the secondary light including a portion of the primary light that has been color-converted by an excitation of the phosphors contained in the luminescent color conversion layer, and wherein a thickness of the luminescent color conversion layer is equal to or smaller than three times a particle size of the integrated particles.

2. The light emitting device according to claim 1, wherein dispersing powders are mixed in the synthetic resin material to disperse the integrated particles.

3. The light emitting device according to claim 1, wherein the phosphors comprise garnet-based phosphors and the dispersively binding material comprises an alumina.

4. The light emitting device according to claim 1, wherein a particle size of the phosphors is in a range of 1 μm to 7 μm.

5. The light emitting device according to claim 4, wherein the particle size of the phosphors is substantially equal to a particle size of the dispersively binding material.

6. The light emitting device according to claim 1, wherein the particle size of the integrated particles is equal to or greater than 10 μm.

7. The light emitting device according to claim 1, wherein, inside the luminescent color conversion layer, the integrated particles are distributed in a region near the light emitting surface of the light emitting element.

\* \* \* \* \*